United States Patent
Wang et al.

(10) Patent No.: US 8,670,109 B2
(45) Date of Patent: Mar. 11, 2014

(54) LASER CHARACTERIZATION SYSTEM AND PROCESS

(75) Inventors: Yin Wang, Princeton, NJ (US); Gerard P. Wysocki, Princeton, NJ (US); Feng Xie, Painted Post, NY (US); Chung-En Zah, Holmdel, NJ (US)

(73) Assignee: Corning Incorporated, Corning, NY (US)

(*) Notice: Subject to any disclaimer, the term of this patent is extended or adjusted under 35 U.S.C. 154(b) by 156 days.

(21) Appl. No.: 13/303,648

(22) Filed: Nov. 23, 2011

(65) Prior Publication Data

US 2012/0268743 A1 Oct. 25, 2012

Related U.S. Application Data

(60) Provisional application No. 61/419,042, filed on Dec. 2, 2010.

(51) Int. Cl.
*G01N 21/00* (2006.01)

(52) U.S. Cl.
USPC ............................................. 356/72

(58) Field of Classification Search
USPC .................. 356/72, 417; 362/233
See application file for complete search history.

(56) References Cited

U.S. PATENT DOCUMENTS

| | | | |
|---|---|---|---|
| 6,501,260 B1 | 12/2002 | Hu et al. | 324/158.1 |
| 7,733,924 B2 | 6/2010 | Wysocki et al. | 372/20 |
| 2005/0164415 A1 | 7/2005 | Okunuki | 438/14 |
| 2008/0159341 A1* | 7/2008 | Patel et al. | 372/20 |

FOREIGN PATENT DOCUMENTS

| | | |
|---|---|---|
| JP | 2000353844 | 12/2000 |
| JP | 2008034548 | 2/2008 |
| KR | 1020010073821 | 8/2001 |

OTHER PUBLICATIONS

G. Wysocki, et al., "Widely tunable mode-hop free external cavity quantum cascade lasers for high resolution spectroscopy and chemical sensing," 2008, *Applied Physics B*, vol. 92, pp. 305-311.

* cited by examiner

*Primary Examiner* — Tarifur Chowdhury
*Assistant Examiner* — Abdullahi Nur
(74) *Attorney, Agent, or Firm* — Gregory V. Bean

(57) ABSTRACT

A system and process for automatically characterizing a plurality of external cavity semiconductor laser chips on a semiconductor laser bar separated from a semiconductor wafer. The system includes a diffraction grating and a steering mirror mounted on a rotary stage for rotating the diffraction grating through a range of diffraction angles. A laser bar positioning stage for automatically aligning each laser chip in a laser bar with the diffraction grating. Reflecting a laser beam emitted from a laser chip in a laser bar with diffraction grating and steering mirror to the laser analyzer. Automatically rotating the diffraction grating through a range of diffraction angles relative to the laser beam and automatically characterizing the laser optical properties such as spectra, power, or spatial modes with the laser analyzer at each diffraction angle.

23 Claims, 7 Drawing Sheets

FIG. 6
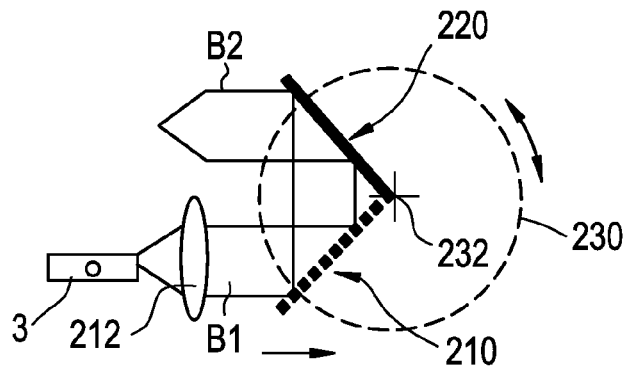
FIG. 7
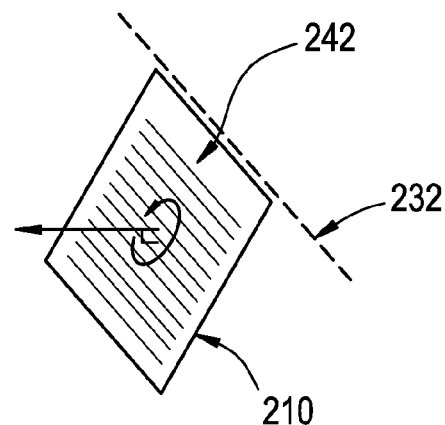
FIG. 8
FIG. 9
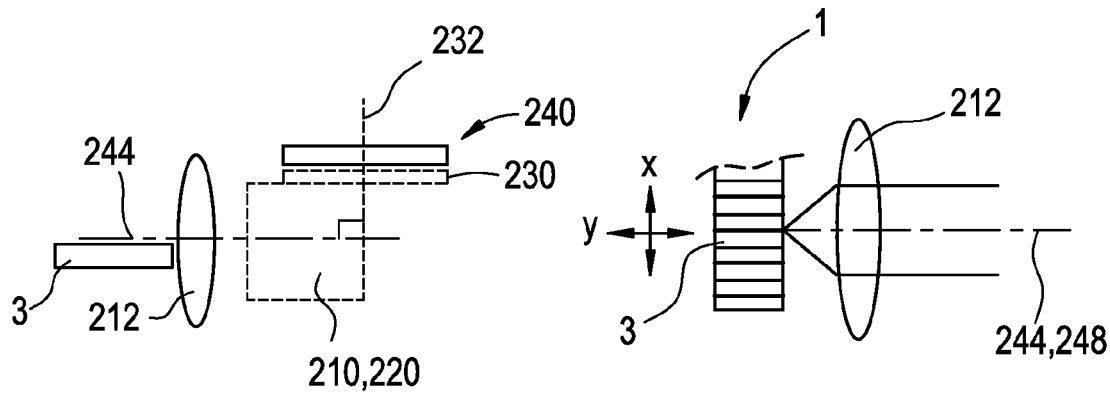
FIG. 10
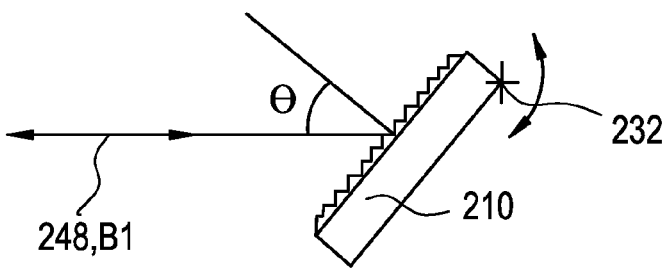

LASER CHARACTERIZATION SYSTEM AND PROCESS

CROSS-REFERENCE TO RELATED APPLICATIONS

This application claims the benefit of priority under 35 U.S.C. §119 of U.S. Provisional Application Ser. No. 61/419,042 filed on Dec. 2, 2010, the content of which is relied upon and incorporated herein by reference in its entirety.

BACKGROUND

The disclosure relates to a system and process for characterization of semiconductor lasers, and more particularly for characterization of external cavity semiconductor lasers, and more particularly for automated testing and characterization of each external cavity semiconductor laser chips in a bar of laser chips prior to separation and mounting of each individual chip from the bar.

A quantum cascade laser (QCL) is a type of unipolar semiconductor laser that emits light primarily in mid-infrared (MIR) and far-infrared (FIR) wavelength range, e.g. in a range of wavelengths from about 3 µm to about 15 µm. An external cavity quantum cascade laser (EC-QCL) is a laser system combining a quantum cascade gain block (e.g. a laser chip with antireflection coatings on one facet) and an external cavity. The external cavity typically includes a collimation lens and a diffraction grating mirror (or simply diffraction grating). In a common Littrow configuration for a tunable external cavity semiconductor diode laser, the light emitted from the quantum cascade gain block is reflected by the diffraction grating at the first order diffraction back along the original beam path and back into the quantum cascade gain block to achieve lasing. Such a laser system is typically carefully designed so that it can lase at a single wavelength, which is determined by the grating angle (or Littrow angle) of the grating mirror. The grating angle is the angle between an axis extending normal to the diffraction grating and the axis of the path of the beam of light emitted from the quantum cascade gain block. When the diffraction grating rotates or pivots, the grating angle changes, and the lasing wavelength of the laser beam produced by the EC-QCL also changes. The lasing wavelength of an EC-QCL laser system can therefore be tuned within a certain range by rotating the grating mirror. The range within which the lasing wavelength can be tuned is determined by parameters such as the gain profile of the quantum cascade gain block, the anti-reflective (AR) coating on the facet of the gain block, the coupling efficiency between the gain block and external cavity, and the reflectivity of the first order diffraction of the grating mirror.

EC-QCLs provide a relatively wide spectral tunability of a single frequency mid-IR radiation, which finds numerous applications in mid-IR spectroscopy and molecular sensing. Characterization and optimization of the EC-QCL gain media parameters, such as characterization of the tuning range and electrical properties of the laser, play one of the most important roles in the EC-QCL development and design. Traditional methods for fabrication, characterization and selection of QCL gain media in the EC-QCL configuration requires several stages: 1) design, growth, and processing of the wafers, 2) wafer cleaving and separation into single EC-QCLs chips, 3) chip die bonding/mounting, 4) chip facet coating (one at a time), 5) individual EC-QCL chip testing, characterization and optimum gain media selection. While stage #1 is usually optimized to the best industrial standards, the processes of stage #2 to stage #5 are typically performed manually and are difficult to implement in high-volume industrial manufacturing and research and development environments. The separating, mounting, testing and characterization of each individual EC-QCL chip requires a significant amount of time and a well qualified operator to perform the complex laser-cavity alignment. Characterization of the laser chips is therefore a costly, time consuming and labor intensive process. There is a need for a process and system for testing and characterizing EC-QCL and other types of external cavity (EC) laser chips at the earliest stage of fabrications, such as prior to one or more of stage #2 through stage #5 described above, that eliminates wasted time and effort spent in stages #2 to stage #5 and provides a more efficient and cost-effective laser testing and characterization process.

SUMMARY

One embodiment as described herein provides a system and process for performing fully automated testing and characterization of anti-reflective (AR) and/or high reflection (HR) coated external cavity laser bars (with 40 QC gain blocks) before separating them into individual laser chips/diodes. The system and process hereof assures a stable optical axis of the output laser beam with no beam steering and no walk-off during the tuning process. The system and process hereof also provides a stable external cavity design with precise, automatic laser-cavity alignment and/or characterization. By providing access to only one facet of quantum cascade laser chip at a time, complications with the alignment of a second collimating lens for the output laser radiation is avoided, which is particularly beneficial in the case of quantum cascade lasers having waveguides of different lengths.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 6 is a schematic illustration of the alignment of the diffraction grating and steering mirror on a rotary stage in the EC module of FIG. 5;

FIG. 7 is a schematic illustration of the alignment of the diffraction grating with the rotational axis of the rotary stage in the EC module of FIG. 5;

FIG. 8 is a schematic illustration of the alignment of the collimating lens with the diffraction grating and rotary stage in the EC module of FIG. 5;

FIG. 9 is a schematic illustration of the alignment of a QCL chip with the collimating lens in the EC module of FIG. 5;

FIG. 10 is a schematic illustration of the alignment of the diffraction grating at the glazing angle in the EC module of FIG. 5 with the beam from a laser chip in the system of FIGS. 2 and 3;

DETAILED DESCRIPTION

Figure 1:
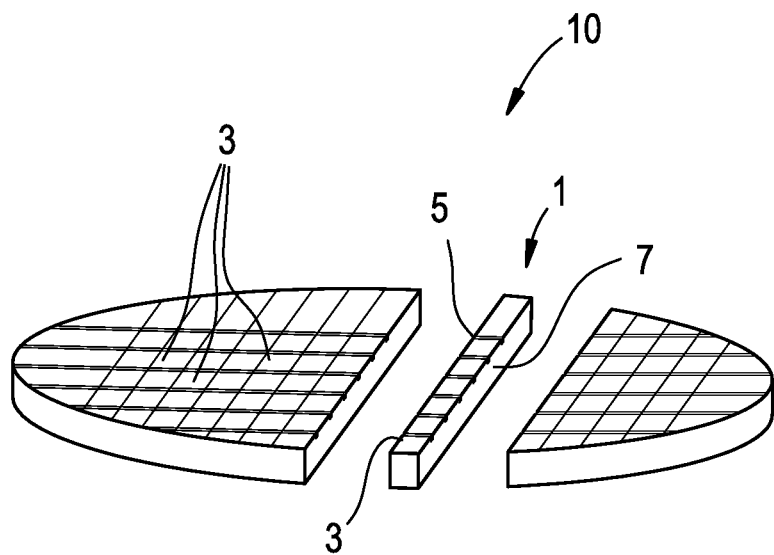
FIG. 1 is a perspective schematic illustration of a bar of QCL laser chips cut from a wafer with rows of QCL chips formed thereon.

Reference will now be made in detail to the present preferred embodiment(s), an example of which is/are illustrated in the accompanying drawings. Whenever possible, the same reference numerals will be used throughout the drawings to refer to the same or like parts.

The present disclosure provides a system and process for automatic alignment, testing and characterization of a plurality of laser chips on a bar cut from a semiconductor wafer, before separating the laser chips into individual laser chips or mounting of the individual chips for subsequent handling or testing and characterization. As schematically illustrated in FIG. 1, a semiconductor wafer 10 has a plurality of laser chips 3 formed thereon in a plurality of rows. As illustrated in FIG. 1, the wafer 10 is cleaved to separate individual rows of laser chips from the wafer, 1.e. to separate individual bars 1 of semiconductor material having a plurality of laser chips 3 arrayed thereon (a "laser bars") from the wafer. The laser chips may be, for example, 40 QCL Fabry-Perot cavity waveguide laser chips or gain blocks arrayed I parallel along the length of the laser bars 1. The cleaved facet 5 on one side of a laser bar 1 may be provided with a highly-reflective (HR) coating on one end of the waveguide and the cleaved facet 7 on the other side of the laser bar may be provided with an (AR) coating on the other end of the waveguide. Uncoated chips may also be tested with the system and process described herein.

One embodiment of a system for automatic alignment, testing and characterization of semiconductor laser chips 3 on a laser bar 1 will now be described with reference to FIGS. 2 and 3. A laser characterization system according to an embodiment hereof includes a laser bar positioning stage module (PS module) 100 and an external cavity module (EC module) 200. The PS module 100 is configured to move the laser bar 1 in a controlled manner relative to the external cavity (EC) module 200, in order to align the laser chips 3, one by one, with the EC module. The EC module is in turn configured to rotate or pivot a diffraction grating 210 in a controlled manner in relation to the laser chips on the PS module. A collimating lens 212 is positioned between the PS module 200 and the EC module to collimate the light L emitted from a laser chip 3 aligned with the EC module and focus a collimated beam of light B1 onto the diffraction grating 210. The collimating lens may be a pre-aligned part of the EC module 200. The collimating lens 212 may be a fast (f-number f#≤1) aspheric lens with AR-coating, corrected to eliminate spherical aberrations, designed especially for calibration of the highly divergent beams. By way of example only, the collimating lens 212 may be a 1" diameter, f/0.6, Ge, AR-coated lens designed for wavelengths between 3 and 12 μm. The collimating lens may be mounted on translation stage or lens alignment module, such as a conventional 3D translation stage as are known in the art for providing linear motion. Stage may be preferably equipped with remotely controlled piezo-motors for positioning lens 212 as needed for laser optical alignment.

The entire system in one embodiment hereof may be sealed within a vacuum-tight housing (not shown), so the simplest way to align the collimating lens 212 is with an automated movable stage 238 or other lens positioning mechanism. In embodiments where the collimating lens is not inside a housing, other modes of adjustment, including manual adjustment, may be used.

Figure 4:
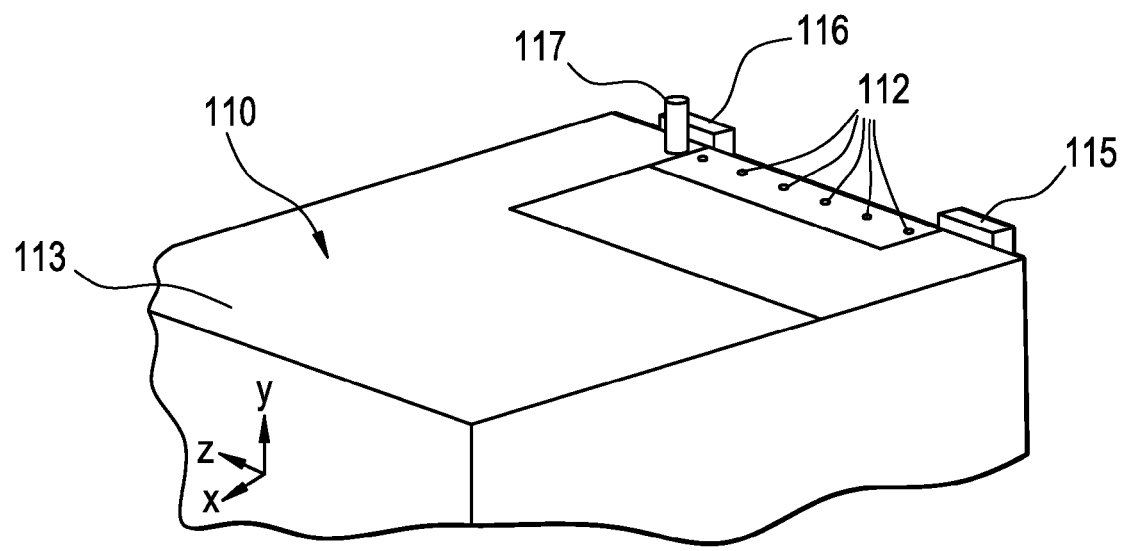
FIG. 4 is a perspective schematic illustration of an embodiment of a laser bar vacuum chuck fixture for use in the system of FIGS. 2 and 3.

According to one embodiment hereof, the PS module 100 may include a vacuum chuck 110, a positioning stage 120, and an electronic probe 130. The vacuum chuck 110 is mounted on top of the positioning stage 120 for precisely mounting a laser bar 1 to be characterized on the positioning stage 120. As illustrated in FIG. 4, a row of vacuum holes 112 are provided in the planar top surface 113 of the vacuum chuck and form a laser bar mounting station parallel to and adjacent an edge of the vacuum chuck facing the EC module 200. Air is drawn through the vacuum holes in order to create a suction on the bottom surface of a laser bar 1 placed on the mounting station (e.g. on the top surface of the chuck over the vacuum holes) and thereby secure the laser bar in place on the mounting station on the chuck. A pair of precisely located alignment abutments 115, 116 and a precisely located locating abutment 117 extend up from the top surface of the vacuum chuck. The alignment abutments 115, 116 engage opposing ends of the AR coated edge 7 of the laser bar 1 for pre-aligning the laser bar 1 relative to the positioning stage 120 and the EC module. The locating abutment 117 engages one end of the laser bar to transversely pre-locate the laser bar on the chuck 110. The alignment abutments are illustrated as plates, but it will be appreciated that the alignment abutments could be pins or other structure. Similarly, the locating abutment 116 is illustrated as a pin, but could be a plate or other structure. Alternatively, in place of the alignment and locating abutments, a precisely formed and positioned locating slot may be precisely formed in the top surface of the chuck for receiving, aligning and locating a laser bar on the positioning stage. In which case, the row of vacuum holes 112 would be provided in the bottom of the locating slot. The vacuum chuck 110 may be formed of a conductive material, such as copper, and temperature controlled with a thermoelectric cooler (TEC) module 150 in order to cool the laser bar 1 and maintain the laser bar at a substantially constant temperature. Alternatively, cooled fluid from a cooling unit, such as a refrigerator, may be circulated through coolant passages provide in the chuck in place of the TEC.

The positioning stage 120 is connected to a computer or controller 160 for precisely controlling the motion of positioning stage and automatically aligning individual laser chips 3 on the laser bar with the EC module 200 for automated testing and characterization. For example, the positioning stage 120 may be a precision 6 axis-translation stage, for example a 6 axis hexapod, such as a PI F-206.S HexAlign™ from Physik Instrumente (PI) GmbH. The 6 axis-hexapod positioning stage provides precise translation and rotation of a laser bar 1 for repeatable locating and alignment of individual laser chips 3 on a laser bar 1 relative to the EC module 200.

The electronic probe 130 is mounted on the positioning stage 120 (or the chuck 110) by a motorized probe manipulator 132. The probe manipulator 132 is controlled by the controller 160 for automated movement of the electronic probe 130 into and out of top electrical contact with a laser chip 3 on the laser bar 1 that is aligned with the EC module to activate the laser chip. The laser chip is electrically grounded through the conductive vacuum chuck 110. Alternatively, an electrical contact maybe provided on the top surface 113 of the vacuum chuck in the mounting station for contacting and grounding the laser chips on the laser bar. The electronic probe 130 may be mounted on the stage by one or more motorized micro stages for automated movement of the probe into and out of contact with each individual laser chip on the laser bar. For example, the electronic probe may be mounted on 2 motorized micro stages, one microstage for movement in the horizontal x direction along the laser bar from laser chip to laser chip and one micro stage for movement in the vertical z direction into and out of engagement with a select laser chip. For example, the probe manipulator may include two MM-3M motorized Micro-Mini™ stages from National Aperture, Inc. The probe manipulator is co-located on the positioning stage 120 with the vacuum chuck 110, so that the electronic probe 130 moves with the laser bar 1 on the vacuum chuck 110 as the positioning stage 120 is moved to align a laser chip 3 with the EC module 200.

Figure 2:
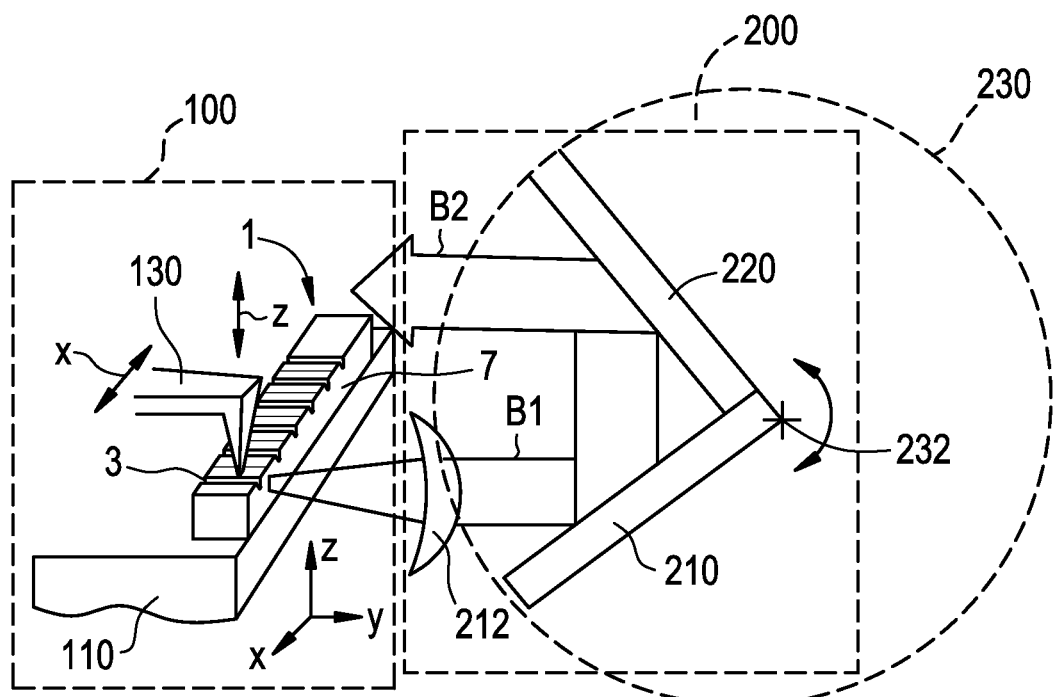
FIG. 2 a schematic illustration of an embodiment of a laser bar testing and characterization system according to an embodiment hereof.
Figure 3:
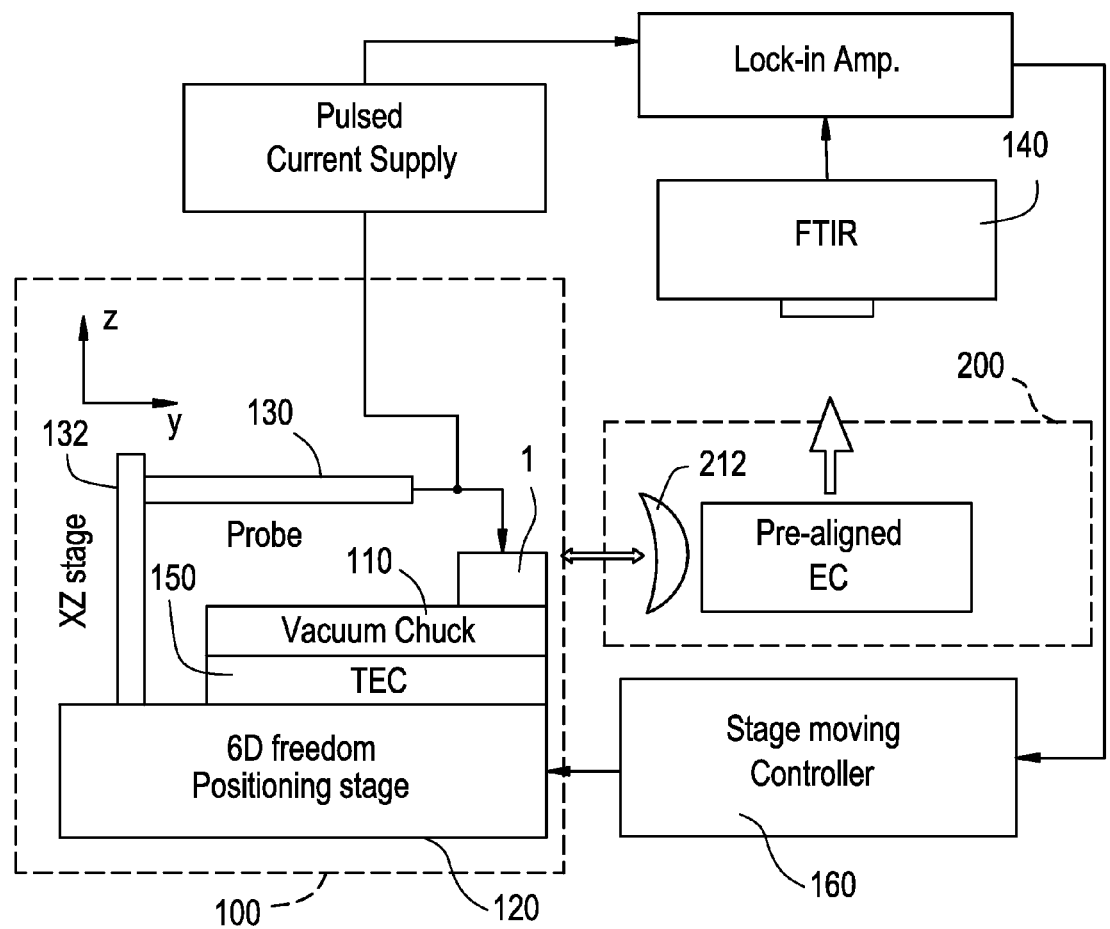
FIG. 3 is a functional block diagram of the laser bar testing and characterization system of FIG. 3.
Figure 5:
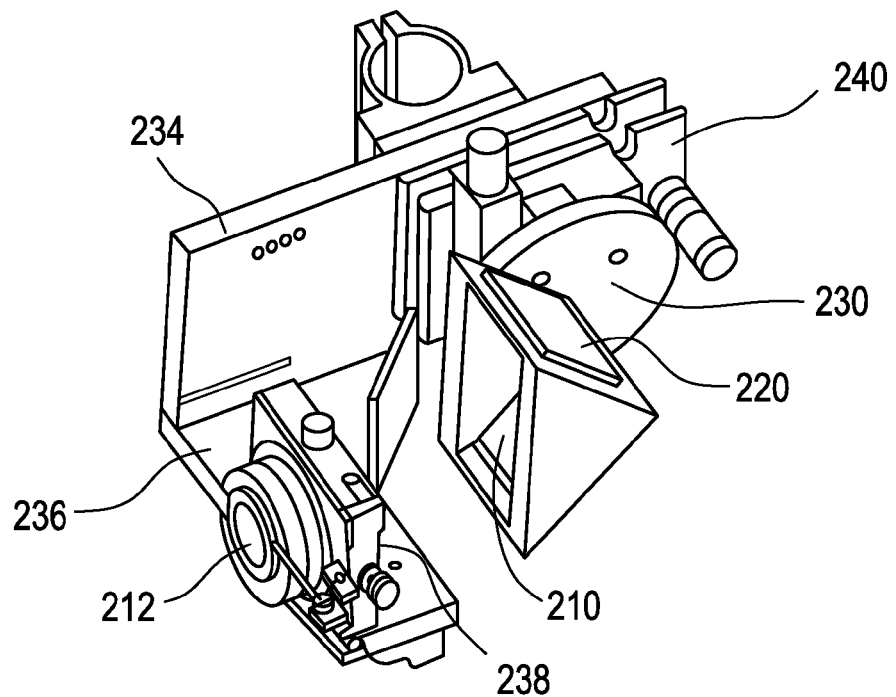
FIG. 5 is a schematic illustration of an embodiment of an external cavity module (EC module) for use in the system of FIGS. 2 and 3.

An external cavity ("EC") module 200 according to one embodiment hereof is schematically shown in FIGS. 2, 3 and 5. The EC module 200 includes a diffraction grating 210 and a beam steering mirror 220 pre-aligned on a rotary stage 230 to form a diffraction grating unit. The diffraction grating 210 and the beam steering mirror 220 are mounted at a right angle to each other on a vertically oriented rotary stage 230. The rotary stage 230 has a horizontal rotary axis 232 for rotating the diffraction grating 210 and the beam steering mirror 220 relative to a laser chip to be tested in a laser bar mounted on the vacuum chuck 110 at the mounting station. The diffraction grating 210 and the beam steering mirror 220 are mounted at a right angle to each other, so that the output beam B2 remains substantially steady in its trajectory and does not "walk-off" as the diffraction grating is rotated during characterization.

The laser analyzer 140 is located to receive and analyze the output beam B2 and to profile the spatial distribution of the beam. The laser analyzer 140 may be a Fourier Transfer Infrared spectrometer (FTIR) for spectral characterization of the laser chips or any other optical test equipment such as a grating spectrometer, M^2 (beam quality) measurement system, simple power meter, polarimeter, an interferometer based on the needs of the user. The optical signal detected by the analyzer can be demodulated by a lock-in amplifier 170 for improved noise rejection.

The diffraction grating 210 may be any suitable reflective grating that has appropriate resolving power and efficiency, including but not limited to a ruled reflective diffraction gratings blazed for the desired wavelength region. An example of a suitable grating is a ruled diffraction grating blazed for a wavelength of 5.4 μm having 300 grooves/mm. Likewise, the steering mirror 220 may comprise any suitable reflecting surface, including but not limited to gold, silver or aluminum coated mirrors, which can provide high reflectivity within broad range of wavelengths.

The rotary stage may be mounted on a support frame 234 and the support frame may be vertically adjustably in the Z direction mounted on a column (not shown in FIG. 5) or other supporting structure. The rotary stage 230 may be mounted on the support frame 234 via tilt stage 240 for adjusting the horizontal tilt of the rotary stage 230, and therefore adjusting the tilt of the diffraction grating 210 and the beam steering mirror 220 relative to a laser chip to be tested mounted on the vacuum chuck 110. The pivotal axis of the tilt stage should be perpendicular to the axis of rotation of the grating rotary stage 230. The collimating lens may be mounted on an arm 236 extending from the support frame 234 via a lens positioning mechanism 238, such that the collimating lens may be precisely located between a laser chip 3 to be tested mounted on the vacuum chuck 110 and the diffraction grating 210. Suitable drive devices, such as stepper motors, may be employed to rotate the rotary stage 232 and the tilt stage 240 in order to align the EC module, as described in more detail hereinafter, and to move the support frame 234 on the column under the automated control of the controller 160 or under manual control.

There are many degrees of freedom of adjustment of the external cavity in external cavity lasers. In order to perform a reliable alignment of the EC module 200 with the laser chips 3 on a laser bar 1 and assure good coupling of the EC module within the entire tuning range of the chips 3, the elements of the EC module should be carefully pre-aligned. In embodiments hereof where the collimating lens is part of the EC module, the following EC module pre-alignment requirements should be satisfied.

First EC module pre-alignment requirement. As illustrated in FIG. 7, the diffraction grating 210 should be mounted on the rotary stage 230 such that the grooves 242 in the diffraction grating 210 are aligned parallel to the rotary axis 232 of the rotary stage 230 (or the rotary axis 232). Otherwise, the reflected and diffracted beam will not coincide with the laser optical axis when the diffraction grating is rotated.

Second EC module pre-alignment requirement. As illustrated in FIGS. 2 and 6, the diffraction grating 210 and the beam steering mirror 220 should be mounted on the rotary stage 230 such that the two planes defined by the surfaces of the diffraction grating 210 and the steering mirror 220 are oriented at a right angle to each other and the intersection of these two surfaces coincides with the rotary axis 232 of the rotary stage 230. Otherwise, the output beam B2 will "walk-off" when the diffraction grating is rotated during the wavelength characterization process.

Third EC module pre-alignment requirement. As illustrated in FIG. 8, the orientation of the tilt stage 240 and/or the position of the collimating lens 210 should be adjusted so that the rotary axis 232 is oriented normal to the axis 244 of the collimation lens (the lens axis 212). Otherwise, the diffraction beam reflected back toward laser chip 3 being characterized will walk-off when the diffraction grating is rotated during the wavelength characterization process, which will reduce the coupling efficiency of the EC with the laser chip 3

Once the EC module pre-alignment requirements are met, then the alignment of the elements of the EC module may be permanently fixed, so that the EC module remains properly aligned for future laser characterizations.

If not already so mounted, the aligned EC module is now mounted on the column or other supporting structure (not shown), such that the EC module is adjacent to and facing the PS module. In order for the reflected diffraction beam to be adequately couple back into the laser waveguide/gain block of the laser chip 3 being characterized for lasing to be achieved, two EC module-PS module alignment requirements should be met.

First EC module-PS module alignment requirement. As illustrated in FIG. 9, the position and orientation of the positioning stage 120 and/or the vertical position of the EC module 200 on the column should be adjusted so that the axis of a light beam 248 emitted from a first laser chip 3 to be characterized (or simply the beam axis 248) on a first end of a laser bar is aligned and coincides with the lens axis 244 of the collimating lens.

Second EC module-PS module alignment requirement. As illustrated in FIG. 10, the rotary stage should be adjusted/rotated so that surface of the diffraction grating 210 is oriented relative to the beam of light B1 at the grating angle or Littrow angle $\Theta$. The first and second EC module-PS module alignment requirements or steps may require manual pre-alignment when the system is first initialized for a specific laser bar configuration.

In order to characterize the chips 3 on a laser bar 1 in a process according to one embodiment hereof, the components of the EC module area pre-aligned and the EC module is pre-aligned with the PS module as described above. The system is now ready to be auto-aligned prior to characterization the laser chips on a laser bar. In order to auto the system, first the electronic probe 130 is moved up and away from the aligning abutments 115, 116 and the locating abutment 117. A laser bar 1 is then located on the mounting station on the top surface 113 of the vacuum chuck 110 with the AR coated face 7 of the laser bar in contact with the alignment abutments 115, 116 and the end of the laser bar in contact with the locating abutment 117. The size and type of the laser bar is entered into the controller, which is pre-programmed to automatically locate, align and analyze the laser chips on the laser bar. The laser bar 1 may, for example, be a bar of 40 EC-QCL laser chips ($C_1, C_2, C_3 \ldots C_{40}$). It will be appreciated that the system and process hereof may be used to test and characterize other types of lasers. If the vacuum to the vacuum chuck is not already turned on, the vacuum is now turned on in order to retain the laser bar in place on the vacuum chuck. The desired range of grating angles $\Theta$, i.e. the minimum and maximum grating angles and the number n of increments of grating angles, $\Theta_1, \Theta_2, \ldots \Theta_n$, to be characterized are also entered into the controller. The range of grating angles $\Theta$ to be tested is determined by the width of the laser chip gain profile. For example, for a laser tuning range of from 4.5 um to 4.7 um, the grating angle range to be tested can be calculated from the Bragg equation as approximately from 2 degrees to 3 degrees. The number of increments n of grating angles $\Theta$ to be tested may be chosen based on the maximum total characterization time one can afford. For example, the number of increments n may be set to 15 or 20.

The control software may be designed such that, before the actual characterization of each laser chip 3, an auto-alignment procedure is executed to find the optimum external cavity coupling position and alignment for each laser chip $C_1, C_2, C_3 \ldots C_n$. If not already done during pre-alignment of the EC module and the PS module, the controller then rotates the rotary stage 230 to orient the diffraction grating 210 at the grating angle $\Theta$ and translates and rotates the positioning stage 120 to locate and align the first laser chip $C_1$ opposite and in alignment with the diffraction grating 210. The controller also moves the electronic probe 130 into contact with a first laser chip 3 $C_1$ on the laser bar 1. The controller then operates the first laser chip $C_1$ in a pulsed mode to activate the first laser chip $C_1$. The optical signal or output beam B2 is detected by a laser analyzer 140. The laser analyzer may be used to profile the spatial distribution of the beam. The laser analyzer may be demodulated by a lock-in amplifier 170. The lock-in output of the spectrometer, which is proportional to the optical power of the output beam B2, is fed back to the controller 160 for auto-alignment by automated movement of the positioning stage 120 by the controller.

Final auto-alignment of the EC module with the PS module so that the first laser chip $C_1$ is precisely located and oriented in alignment with the EC module may be performed as follows. The controller translates the positioning stage 120 within a predetermined range of motion, for example a translation of typically about +/−25 μm in the x and z directions, for a total translational range of about 50 μm, while the power of the emitted beam B2 is monitored by the laser analyzer 140. The user can elect to additionally perform auto-adjustment of the beam collimation quality by translating the positioning stage 120 in the y direction within a predetermined range of motion while simultaneously performing x and z auto-alignment for each y position. This can, for example, include a translation of typically about +/−10 μm in the y direction. The controller records the location of the positioning stage at which the power of the emitted beam B2 by the first laser chip is the greatest in memory as the aligned position for the first laser chip C1.

Once the first laser chip $C_1$ is optimally aligned, the system is ready to test and characterize the first laser chip. However, the system may first optionally automatically determine pre-aligned positions for each of the remaining laser chips $C_2, C_3 \ldots C_n$. In order to determine pre-aligned positions for each of the remaining laser chips, the controller deactivates the electronic probe, retracts the electronic probe from the laser bar, and moves the positioning stage to position the last laser chip $C_n$ in pre-alignment with the EC module. The controller then operates the last laser chip $C_n$ in a pulsed mode and translates the positioning stage 120 as previously described to precisely locate and align the last laser chip $C_n$ with the EC module and store the optimally aligned position for the last laser chip $C_n$ in the memory of the controller. Once the optimally aligned positions for the first and last laser chips at both ends of the bar are determined and saved in memory, then pre-aligned positions of all the other laser chips on the bar are calculated by the controller and stored in memory. The orientation of the laser bar may be adjusted based on the optimum positions determined for the first and the last chips. With this information system is ready to characterize each individual laser chip on the laser bar.

The pre-alignment and alignment of the system, e.g. the locating of the first and last laser chips on the laser bar and the final alignment of the PS module, may all be performed automatically. Alternatively, in order to speed up the initialization process, the pre-alignment may be manually performed by positioning stage by manually pre-aligning the fist and last laser chips, $C_1$ and $C_n$, with the EC module, with the controller performing the final precise pre-alignment of the fist and last laser chips with the EC module and storing their positions in memory.

With the positions of each of the laser chips determined and stored in memory, the system is now ready to characterize each individual laser chip on the laser bar. Testing and characterization of each laser chip is performed as follows. The controller translates the positioning stage 120 to the aligned positions for the first laser chip $C_1$ in order to align the first laser ship with the EC module. The controller then moves the electronic probe 130 into contact with the first laser chip $C_1$ on the laser bar 1. The controller then operates the first laser chip $C_1$ in a pulsed mode to activate the first laser chip $C_1$. The controller may again perform an automated final alignment check, which is the same process as described in the automated pre-alignment procedure, to precisely align the first laser chip with the EC module. The controller then rotates the rotary stage 230 to orientate the diffraction grating 210 at the minimum grating angle $\Theta_1$, for example a grating angle of 42.45 degree for lasing at 4.500 um and with 300 grooves/mm grating, and operates the first laser chip $C_1$ in a pulsed mode.

First, the current supplied to the laser chip is ramped up to find the threshold current required for lasing. When an output beam is detected using the light output power reading (from the lock-in amplifier), then the supplied current is stored in memory as the threshold current for the first laser chip $C_1$. The optical signal of the output beam B2 is detected in the laser analyzer 140 and a spectrometer is demodulated by a lock-in amplifier 170. The wavelength of the output beam B2 is then determined by the laser analyzer and recorded in memory as the wavelength of the first laser chip at the minimum grating angle $\Theta_1$. The diffraction grating is then incrementally rotated to the second grating angle $\Theta_2$ and the threshold current and the wavelength of the output beam for the first laser chip $C_1$ at the second grating angle $\Theta_2$ is determined in the same manner and stored in memory. This process is repeated for each diffraction grating angle from $\Theta_1$ to $\Theta n$, with the threshold current and the wavelength of the first laser chip at each grating angles $\Theta_1$ to $\Theta n$ being stored in memory.

Once the first laser chip has been fully characterized, then the electronic probe 130 is withdrawn from the first laser chip $C_1$ and the controller moves the positioning state to pre-align the second laser chip $C_2$ with the EC module. The electronic probe is then moved into contact with the second laser chip C2, and the second laser chip is auto-aligned and characterized in the same manner as the previously described in relation to the first laser chip and the threshold current and the wavelength of the second laser chip at each of the grating angles is stored in memory. The alignment and characterization processes are repeated for each laser chip $C_1$ to Cn, and the threshold current and the wavelength for each laser chip at each of the grating angles is stored in memory.

Figure 11:
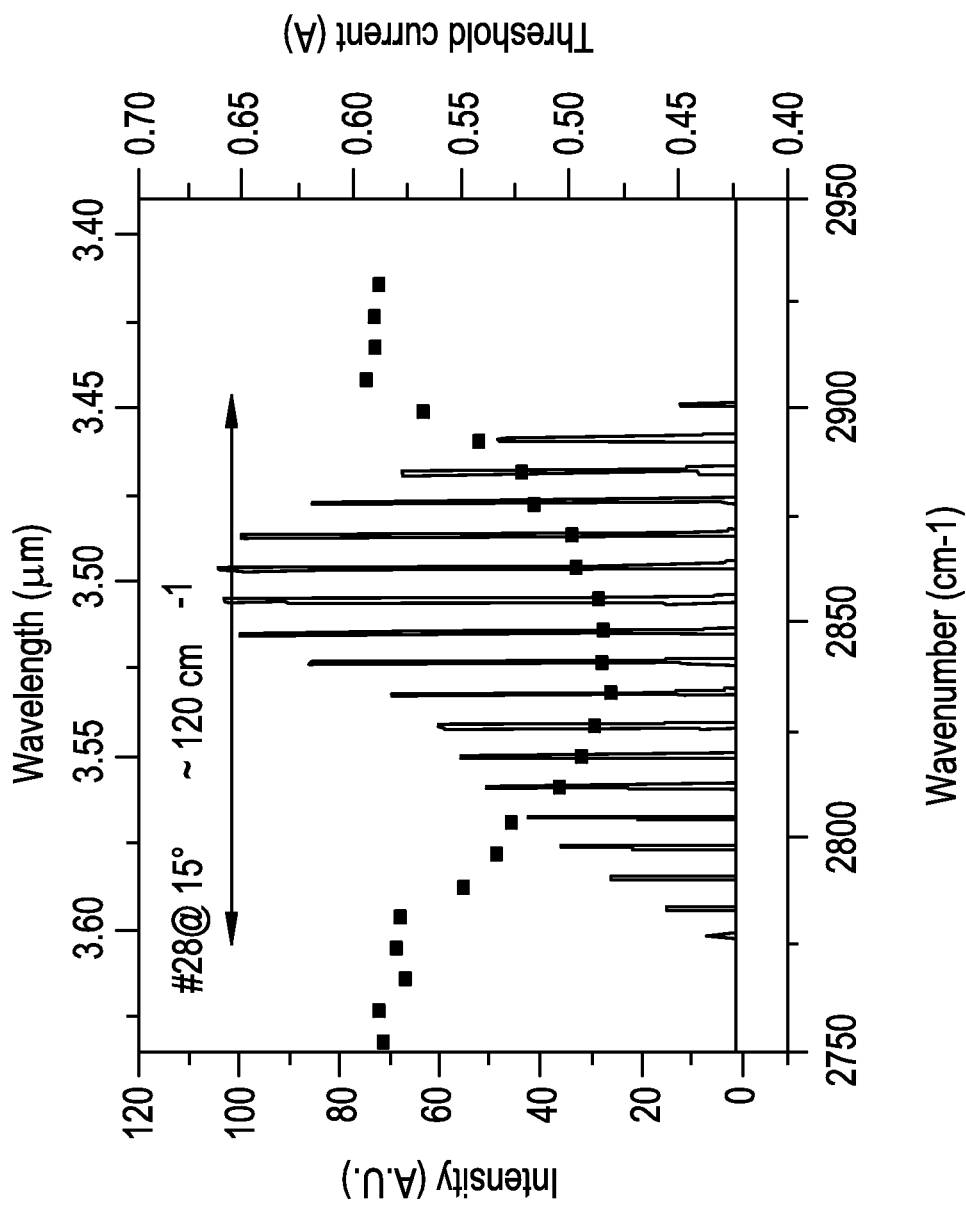
FIG. 11 is a plot showing EC spectral tunability and threshold current spectra for an EC-QCL chip operating at 3.5 μm as characterized by the system of FIGS. 2 and 3.
Figure 12:
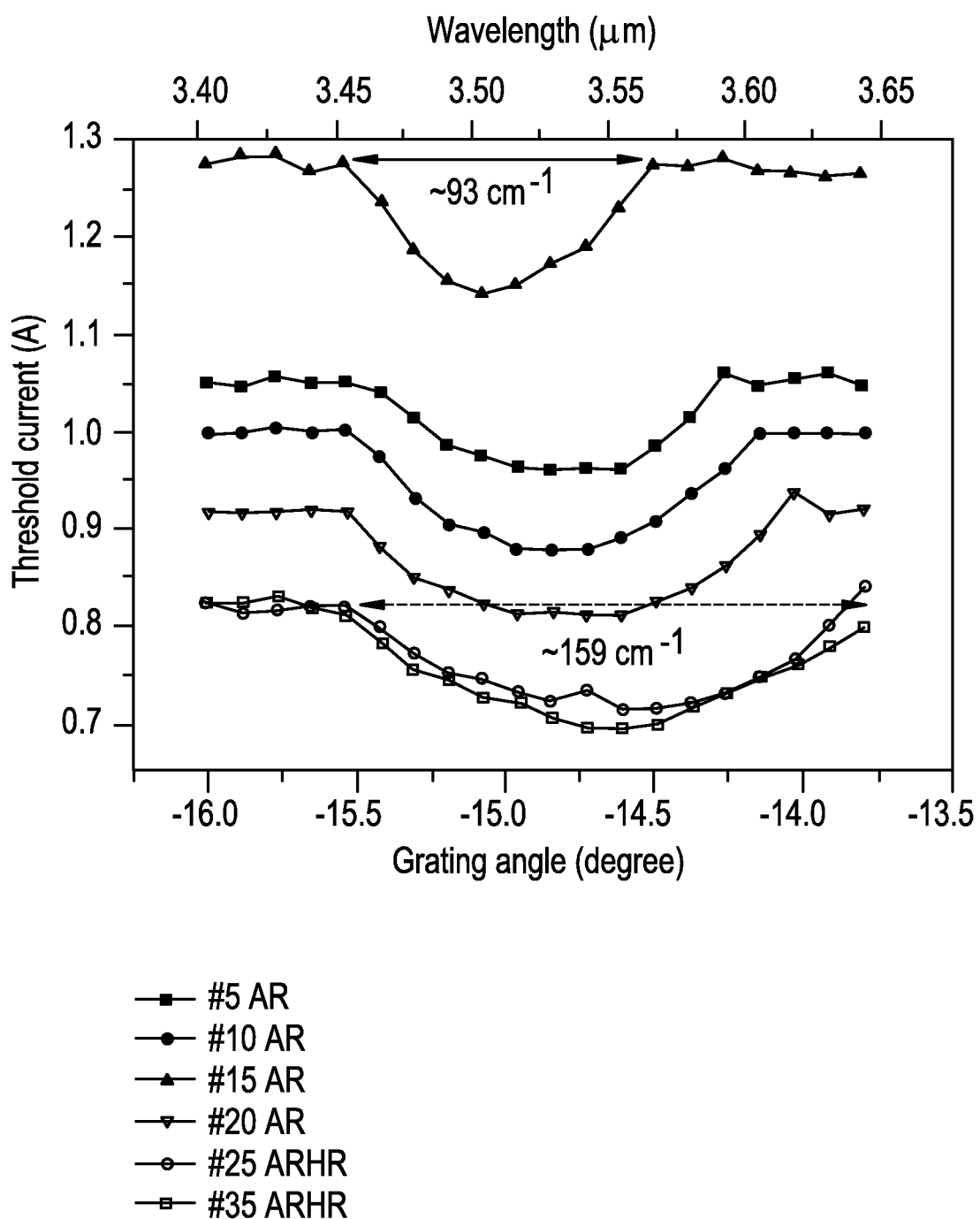
FIG. 12 is a plot showing threshold current vs. grating angle for and select EC-QCL chips on the same bar as characterized by the system of FIGS. 2 and 3.

FIG. 11 is an exemplary plot of the threshold currents (illustrated by the dots and the right-side vertical axis) and intensity in arbitrary units (illustrated by the vertical bars and the left-side vertical axis) detected for an individual laser chip are plotted against wavelength or wavenumber (horizontal axis). As illustrated in FIG. 12, the threshold currents for the characterized laser chips may be plotted against grating angle or wavelength and connected to produce a family of threshold current-wavelength curves. FIG. 12 shows only selected curves for lasers with the same waveguide parameters. The constant threshold current observed outside the tuning range indicates insufficient feedback for external cavity mode lasing. It may be desirable to lase at Fabry Perot (FP) modes, because the FP modes are at the center of the gain curve where the gain is the highest and therefore provide better feedback. The program may save all the data in four different files. One file for storing all measurement parameters and spectral data including all spectra within the tuning range for each laser chip. A second file for storing data on laser threshold vs. grating angle for each laser. A third file for all LI curves for each laser chip. A fourth file for storing the alignment positions for each laser chip. The data may be analyzed and manipulated on Microsoft Excel or similar software for future date processing.

Figure 13:
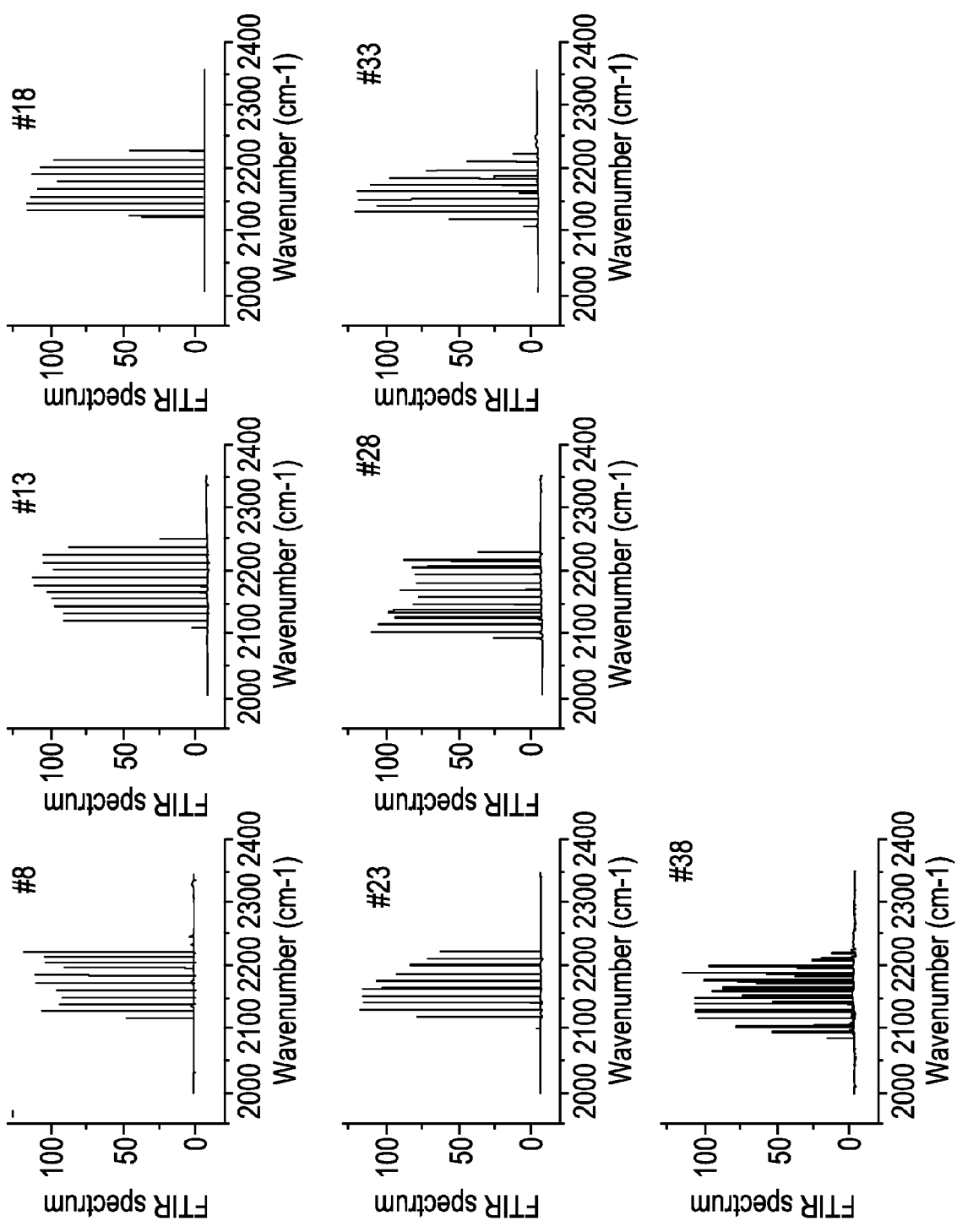
FIG. 13 is a series of plots showing the tuning spectra of select quantum cascade lasers on the same bar as characterized by the system of FIGS. 2 and 3.

FIG. 13 illustrates the wavelength tuning spectra as characterized for selected laser chips on the laser bar having the same stripe width from seven 4.6 μm quantum cascade lasers within a single laser bar. The laser bar may be, for example, a bar of EC-QCL lasers consisting of 40 lasers that have a stripe width that periodically varies from one chip to the next through a select range of strip widths for testing and evaluation of different stripe widths. The tunability of each laser chip can be characterized using all the tuning spectra or the threshold current changes against the grating angle. For example, the tuning spectra or the threshold current changes may be plotted as described herein.

As shown in FIG. 11, each lasing spectrum at each vertical bar corresponds to a single mode lasing at different grating angle $\Theta_1$ to $\Theta_n$. The lasing wavelength shifts (or is tuned) when the grating mirror rotates. The tunability of a laser chip is the widest wavelength range $\Theta$ in which the laser can lase within single mode, which can be determined from the difference of the wavelength (or wave number) of the longest lasing wavelength and the shortest lasing wavelength on the horizontal axis of the plot in FIG. 11. For example, in FIG. 11, the tunability of the characterized laser chip #28 is about 120 $cm^{-1}$ in wave number (from about 2900 $cm^{-1}$ to about 2780 $cm^{-1}$). The plots of FIG. 13 show that the tunability of laser #13 is larger than that of laser #33. When the laser lases at external cavity mode (usually single mode), the lasing threshold is smaller than the threshold of lasing at Fabry-Perot (FP) modes.

As shown in FIG. 11, each black dot is corresponding to the lasing threshold at each wavelength (or at different grating angle). There are some black dots without spectra at the same x-coordinate (wave number). This means that the laser lases at F-P mode, instead of the external cavity mode, at this wave number/grating angle, which is why that those dots are at the same level. The tuning range of the laser is within the range where the threshold current is less than the threshold current at F-P mode. Therefore, by looking at the TI curves of threshold current (against the gating angle or wave number/wavelength); one can determine the tunability of each characterized laser chip. For example, from FIG. 12, one can know that the tunabilities of laser chips #35 and #25 are larger than that of laser chips #20, #10, #5, which have narrower dip in the curve than do laser chips #35 And #25. The smallest tuning range belongs to laser chip #15, which has a plot in FIG. 12 with the narrowest dip having a width of about 93 $cm^{-1}$ as illustrated by the arrow 15. Whereas the largest tuning range belongs to laser chip #35 with the widest dip having a width of about 159 $cm^{-1}$ as illustrated by the arrow 35. With this information, one can pre-selected good laser chips for EC-QCL without going through processes such as dicing, sub-mounting, wire-bonding and, test on each device. Since the tuning range is determined also by the quality of AR coating on each laser facet, the performance uniformity, including AR coating uniformity, within the bar may also be examined at the same time.

Pre-selection of good laser chips for EC-QCL is provided by the system described herein without having to undergo processes such as dicing, sub-mounting, wire-bonding and, test on each device. Since the tuning range is determined also by the quality of AR coating on each laser facet, the performance uniformity, including AR coating uniformity, within the bar may also be examined at the same time using a system as described herein.

With a system as described herein, if the external cavity is off-aligned on purpose, all the laser chips will lase at F-P mode. One can then perform a basic function of the system, measure all the lasing wavelength of every laser chip. Since the procedure is automatic, one can scan all laser bars from one wafer. Therefore one can map the lasing wavelength within a wafer. It will provide useful information feedback to the active gain region designers, growers or for improvement of the wafer fabrication process.

The present disclosure provides an automatic external cavity (EC) laser chip testing and characterization system and process that is capable of performing auto-coupling of multiple laser chips on a laser bar to an external cavity, as well as automatically performing full characterization of the threshold current, emission spectrum and electrical parameters of the EC-QCL chips at different grating angles. The system described herein provides a direct and efficient way of selecting the best gain chips in EC configurations without the need for dicing the laser bar into chips and custom mounting for EC-QCL operation. As a result, the system described herein greatly reduces the labor cost required to select good QC chips for EC QCL system, because: (1) the test is preformed on a laser bar, so labor intensive processes such as dicing, sub-mounting, and wire-bonding are avoided before the test, and (2) the system is fully automated, so that no extra labor is needed once the system is set up to test all chips in similar laser bars. Various embodiments hereof will be understood in view of the following example.

EXAMPLE

A system as described herein was used to test several different QCL gain chips developed and fabricated by Corning Inc. The total time required for full characterization of the 40 lasers on a single bar was approximately 8 hours and included EC alignment, as well as spectral and electrical measurements. The total measurement time was primarily limited by the time required for the laser analyzer spectrometer and the LI curve recording.

The system was used for characterization of short wavelength QCL gain structures with a center wavelength of 3.5 µm. The system was used to test four different QCL bars fabricated by Corning Inc.

Based on a family of LI curves collected by the system, the detected threshold current was plotted against the tested grating angle for all lasing chips coupled to the EC as shown in FIG. 12. FIG. 12 shows only selected curves for laser chips #5, #10, #15, #20, #25, #35 having the same waveguide parameters, which allow evaluating the process homogeneity across the wafer and quality of facet coatings. The constant threshold current observed on both sides of the tuning range indicates insufficient feedback for an EC mode lasing, so that the lasing occurs at the center of the gain curve as Fabry Perot modes. The entire range of threshold currents that are lower than the flat sections at both ends indicates the EC tuning range for each chip. FIG. 11 shows spectral and electrical characterization data for a selected chip. The comparison of the threshold curve with the spectral data collected at each grating position confirms the relationship between the reduced threshold region and the EC mode tuning range.

The EC laser testing and characterization system described herein is capable of automatically coupling of each EC-QCL, or other type of EC laser chips, on a laser bar into the external cavity and automatically measuring the threshold current, tuning spectrum and LI curves at different grating angle of each individual laser chip, all without a need for any manual adjustments by human operators. The total automatic testing time for a bar (40 lasers) may be about 8 hours with spectra and LI curves measurements, and may be about 4 hours with only spectral measurement. It is expected that the processing time can be improved with the use of faster equipment than has been described herein, such as a wavemeter from Bristol Instrument.

It will be apparent to those skilled in the art that various modifications and variations can be made without departing from the spirit or scope of the invention. For example, the vacuum chuck is described and illustrated herein as being mounted on the positioning stage for translational movement in multiple axis relative to the EC module. It will be appreciated that in all of the embodiments herein the EC module may be mounted on the positioning stage for translational movement in multiple axis relative to the chuck, and the chuck may be stationary.

What is claimed is:

1. A system for characterizing a plurality of external cavity semiconductor laser chips on a semiconductor bar separated from a semiconductor wafer, the system comprising:
   (A) an external cavity module (an EC module) comprising:
      (1) a rotary stage having a rotary axis;
      (2) a diffraction grating mounted on the rotary stage; and
      (3) a steering mirror mounted on the rotary stage with a surface of the steering mirror oriented perpendicular to a surface of the diffraction grating;
   (B) a chuck for holding a bar of laser chips (a laser bar), with the EC module being located adjacent to the chuck so that a beam of light emitted from a laser chip in a laser bar held on the chuck intersects the diffraction grating, a first order diffraction beam is reflected by the diffraction grating back into the laser chip to cause the laser chip to lase, and a laser beam emitted from the laser chip is reflected off the diffraction grating and the steering mirror as an output beam;
   (C) a computer controlled multiple axes positioning stage having one of the chuck or the EC module mounted on the positioning stage for translation of said one of the chuck or the EC module along multiple axis; and
   (D) a computer based controller for:
      (1) automatically moving the positioning stage and aligning a laser chip in a laser bar mounted on the chuck with the EC module; and
      (2) operating the aligned laser chip to emit a laser beam.

2. A system as in claim 1, further comprising:
   (E) a laser analyzer positioned opposite the steering mirror to receive and characterize the output beam; and
   wherein the computer based controller receives signals from the laser analyzer and characterizes the output beam.

3. A system as in claim 1, wherein a surface of the diffraction grating facing the chuck has a plurality of parallel diffraction grooves formed therein, and the diffraction grating is mounted on the rotary stage with the diffraction grooves oriented parallel to the rotary axis.

4. A system as in claim 1, wherein an axis defined by an intersection of a plane defined by the surface of the diffraction grating and a plane defined by the surface of the steering mirror coincides with the rotary axis.

5. A system as in claim 1, further comprising a collimating lens having a lens axis, the collimating lens being located between the chuck and the diffraction grating such that a light beam emitted by a chip in a laser bar held on the chuck is collimated into a collimated beam that intersects the surface of the diffraction grating, and the collimated lens is oriented so that the lens axis is normal to the rotary axis.

6. A system as in claim 1, wherein the chuck is formed of a conductive material.

7. A system as in claim 6, further comprising a temperature control unit that control/maintain the temperature of the chuck.

8. A system as in claim 6, further comprising an electronic probe that is moveably mounted relative to the chuck for movement under control of the controller into and out of electrical contact with the top a laser chip to be for supplying current to the chip, the chip being grounded through the conductive chuck.

9. A system as in claim 1, further comprising an electronic probe that is moveably mounted on the positioning stage for movement under control of the controller into and out of electrical contact with the top a laser chip on the laser bar to be tested being held on the chuck for supplying current to the laser chip.

10. A system according to claim 9, further comprising a probe manipulator mounted on the positioning stage and controlled by the controller, wherein the electronic probe is mounted on the probe manipulator for movement in at least one axis of movement of the probe into and out of engagement with individual laser chips in a laser bar held in the chuck.

11. A system according to claim 1, wherein the positioning stage is a precision six-axis translation stage.

12. A system according to claim 2, wherein the controller further automatically rotates the rotary stage to rotate the diffraction grating through a range of grating angles and receives signals from the laser analyzer characterizing the output beam at select grating angles.

13. A process for automatically characterizing a plurality of external cavity semiconductor laser chips on a semiconductor bar separated from a semiconductor wafer (a laser bar), the process comprising:
(B) providing a diffraction unit formed of a diffraction grating and a steering mirror mounted oriented perpendicular to a surface of the diffraction grating;
(C) automatically positioning a laser bar in alignment with the diffraction grating unit, such that a beam of light emitted from a select laser chip in a laser bar held on a chuck intersects the diffraction grating, a first order diffraction beam is reflected by the diffraction grating back into the select laser chip to cause the select laser chip to lase, and a laser beam emitted from the select laser chip is reflected off the diffraction grating and the steering mirror, such that a stable output beam is reflected off the steering mirror as an output beam;
(D) supplying current to the select laser chip causing the select laser chip to lase; and
(E) characterizing the output beam.

14. A process as in claim 12, further comprising the steps of:
(G) supplying an increasing current to the select laser chip until the select laser chip lases; and
(H) identifying the current at which the select laser chip lases as the threshold current of the select laser chip.

15. A process as in claim 13, further comprising the steps of:
(I) automatically rotating the diffraction unit to rotate the diffraction grating through a range of grating angles; and
(J) determining the wavelength of the output beam at select grating angles.

16. A process as in claim 15, wherein:
step (I) comprises incrementally rotating the diffraction unit to incrementally rotate the diffraction glazing mirror through a select plurality of diffraction angles $\Theta 1$ through $\Theta_n$;

step (J) comprises, at each of the diffraction angles $\Theta 1$ through $\Theta_n$:
(1) supplying a current to the select laser chip to cause the select laser chip to lase; and
(2) determining the wavelength of the output beam with a laser analyzer at each diffraction angle.

17. A process as in claim 16, wherein after step (J), further comprising the steps of:
(K) moving the laser bar relative the diffraction unit so that a next select on of the laser chips on the laser bar is aligned with the diffraction unit, and performing steps (I) and (J) for the next select laser chip; and
(L) repeating step (K) until all of the laser chips on the laser bar have been characterized.

18. A process as in claim 16, wherein step (J) further comprises, at each of the diffraction angles $\Theta 1$ through $\Theta_n$:
(3) supplying an increasing current to the select laser chip until the select laser chip lases; and
(4) identifying the current at which each of the select laser chip lases at each of the glazing angles for each of the laser chips.

19. A process as in claim 13, wherein step (C) is performed by mounting the laser bar in a chuck that is mounted on a computer controlled translation stage.

20. A process as in claim 15, wherein in step (I) the diffraction unit is rotated about a rotary axis, and the diffraction unit is pre-aligned by orienting the diffraction grating on the diffraction unit such that a plurality of parallel diffraction grooves formed in the surface of the diffraction grating are oriented parallel to the rotary axis.

21. A process as in claim 20, wherein the diffraction unit is pre-aligned by orienting an axis defined by an intersection of a plane defined by the surface of the diffraction grating and a plane defined by the surface of the steering mirror coincides with the rotary axis.

22. A process as in claim 20, further comprising a collimating lens having a lens axis, the collimating lens being located between the chuck and the diffraction grating such that a light beam emitted by a chip in a laser bar held on the chuck is collimated into a collimated beam that intersects the surface of the diffraction grating; and
wherein the diffraction unit is pre-aligned with the positioning stage such that a select laser chip in the laser is aligned with the collimating lens and the EC module.

23. A process as in claim 13, wherein step (C) comprises:
roughly pre-aligning a select laser chip with the diffraction grating unit;
automatically translating one of the chuck or the diffraction grating unit horizontally and vertically within a specific range of motion;
monitoring the power of the output beam and identifying the location of the positioning stage at which the power of the output beam is the greatest as the aligned position for the select laser chip.

\* \* \* \* \*